United States Patent [19]

Manyoki

[11] Patent Number: 5,994,944
[45] Date of Patent: Nov. 30, 1999

[54] LEVEL CONVERTING CIRCUIT HAVING A HIGH SWITCHING SPEED

[75] Inventor: Zoltan Manyoki, München, Germany

[73] Assignee: Siemens Aktiengesellschaft, Munich, Germany

[21] Appl. No.: 09/150,789

[22] Filed: Sep. 10, 1998

[30] Foreign Application Priority Data

Sep. 10, 1997 [DE] Germany ............................. 197 39 807

[51] Int. Cl.$^6$ ..................................................... H03L 5/00
[52] U.S. Cl. ............................ 327/333; 327/374; 327/52; 326/88
[58] Field of Search ................................... 327/333, 374, 327/391, 437, 52, 54, 55, 65, 67, 73; 330/252, 253, 260, 261; 326/82, 88

[56] References Cited

U.S. PATENT DOCUMENTS

| | | | |
|---|---|---|---|
| 4,071,783 | 1/1978 | Knepper . | |
| 4,656,373 | 4/1987 | Plus . | |
| 4,695,744 | 9/1987 | Giordano . | |
| 5,153,467 | 10/1992 | Mao ........................................... | 326/80 |
| 5,231,318 | 7/1993 | Reddy ........................................ | 327/52 |
| 5,528,173 | 6/1996 | Merritt et al. ............................. | 326/80 |
| 5,550,504 | 8/1996 | Ogihara .................................... | 327/537 |
| 5,818,258 | 10/1998 | Choi .......................................... | 326/83 |

FOREIGN PATENT DOCUMENTS

| | | |
|---|---|---|
| 0 675 602 A1 | 10/1995 | European Pat. Off. . |
| 637624 | 2/1994 | Japan . |

OTHER PUBLICATIONS

"Circuit Techniques for 1.5 V Power Supply Flash Memory", Nobuaki Otsuka et al., IEEE Journal of Solid-State Circuits, vol. 32, No. 8, Aug. 1997, pp. 1217–1720.

*Primary Examiner*—Timothy P. Callahan
*Assistant Examiner*—An T. Luu
*Attorney, Agent, or Firm*—Herbert L. Lerner; Lawrence A. Grenberg

[57] ABSTRACT

The level converting circuit has first and second transistors of a first conductivity type. The control terminals of the transistors are connected to a first supply potential via the load path of the respective other transistor. A load path of a third transistor of a second conductivity type is connected between the control terminal of the first transistor and a reference-ground potential. The control terminal of the third transistor is coupled to the input of the level converting circuit. A node between the second and third transistors forms the output of the circuit. A fourth transistor of the second conductivity type has a load path connected between the control terminal of the second transistor and the control terminal of the third transistor. A capacitance is connected between the control terminals of third and fourth transistors. A limiter circuit is connected upstream of the control terminal of the fourth transistor.

12 Claims, 1 Drawing Sheet

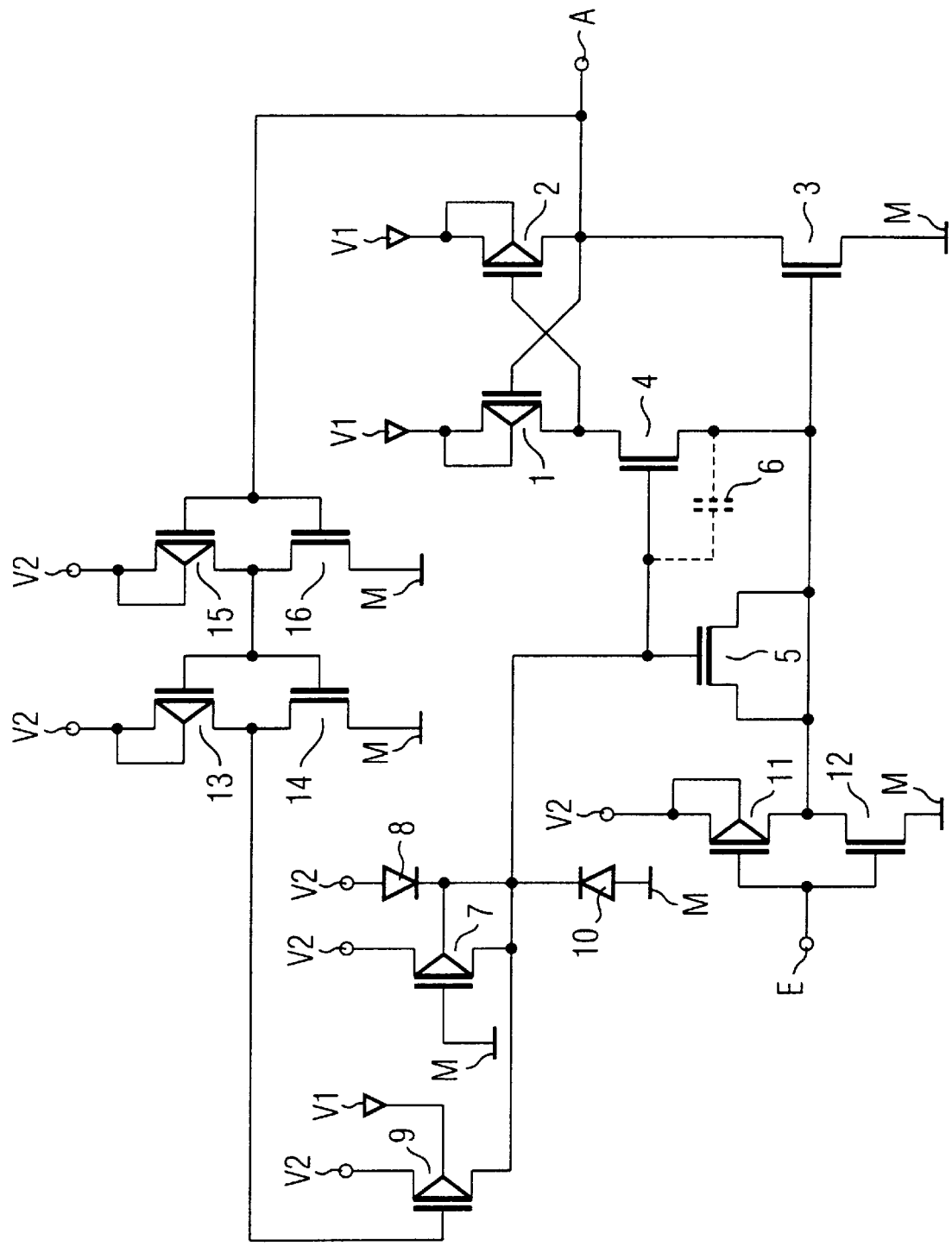

LEVEL CONVERTING CIRCUIT HAVING A HIGH SWITCHING SPEED

BACKGROUND OF THE INVENTION

Field of the Invention

The invention lies in the field of electronic circuits. More particularly, the invention pertains to level converting circuit.

In integrated circuits, in particular, circuit sections which require or output signal levels that differ relative to one another are quite often coupled to one another. Level converting circuits are usually inserted for matching the different signal levels to one another. It is thereby important that the level converting circuit not be slower than the rest of the circuit sections.

SUMMARY OF THE INVENTION

It is accordingly an object of the invention to provide a level converting circuit, which overcomes the disadvantages of the prior art devices and methods of this general type and which provides for a level converting circuit having a high switching speed.

With the foregoing and other objects in view there is provided, in accordance with the invention, a level converting circuit, comprising:

an input and an output;

a first transistor of a first conductivity type having a control terminal and a load path;

a second transistor of the first conductivity type having a control terminal and a load path;

the control terminals of the first and second transistors being connected to a first supply potential via the load path of a respective other one of the first and second transistors;

a third transistor of a second conductivity type having a load path connected between the control terminal of the first transistor and a reference-ground potential and having a control terminal coupled to the input, and wherein a node between the second transistor and the third transistor form the output of the level converting circuit;

a fourth transistor of the second conductivity type having a load path connected between the control terminal of the second transistor and the control terminal of the third transistor, and having a control terminal;

a capacitance connected between the control terminal of the third transistor and the control terminal of the fourth transistor; and a limiter circuit connected (upstream) to the control terminal of the fourth transistor.

The capacitance acts as a bootstrap capacitance which momentarily increases the driving signal at the control terminal of the second transistor. The fourth transistor serves to insulate from one another the first supply potential and the reference-ground potential on the controlled path of the first transistor. In other words, the fourth transistor is intended to prevent a flow of current from the first supply potential to the reference-ground potential when the first transistor is switched on. As a result, however, the second transistor would be driven, in order to be switched off, only by a voltage reduced by the voltage drop across the fourth transistor. It would therefore be switched off relatively slowly. The bootstrap capacitance increases the voltage momentarily and thereby accelerates the switching-off operation.

The limiter circuit is configured in such a way that it permits a momentary increase in the control voltage for the second transistor to a specific value and otherwise limits the voltage to a specific value. This prevents impermissibly high voltages from occurring at the control terminal of the second and fourth transistors. The limiter circuit is active only in the "problem region" of the level converting circuit, and does not influence the other behavior of the level converting circuit.

In accordance with an added feature of the invention, the limiter circuit includes:

a fifth transistor having a control terminal connected to the reference-ground potential and having a controlled path connected between the control terminal of the fourth transistor and a second supply potential; and a (first) diode connected in parallel in a forward direction thereof with the controlled path of the fifth transistor.

In accordance with an additional feature of the invention, there is provided a sixth transistor having a control terminal coupled to the output and having a controlled path connected in parallel with the controlled path of the fifth transistor.

In accordance with another feature of the invention, there is provided a first buffer connected between the control terminal of the sixth transistor and the output. The buffer may, for example, comprise two cascaded inverters.

In accordance with a further feature of the invention, a second diode is connected in a reverse direction between the reference-ground potential and the control terminal of the fourth transistor. The second diode prevents the occurrence of impermissible potentials at the control terminal of the fourth transistor.

In accordance with again an added feature of the invention, a second buffer is connected upstream of the control input of the fourth transistor. The buffer is provided, on the one hand, for creating defined input conditions for an input signal to be applied to the input and, on the other hand, for ensuring low-impedance driving of the fourth transistor and of the bootstrap capacitance.

In accordance with again an additional feature of the invention, at least some of the above-mentioned transistors are MOS field-effect transistors. MOSFETs are distinguished by requiring little space and also by low power losses.

In accordance with again another feature of the invention, the fourth transistor is a MOS field-effect transistor, and the capacitance is a gate-source capacitance of the fourth transistor. In other words, the gate-source capacitance of the fourth transistor is correspondingly configured to form the bootstrap capacitance. The bootstrap capacitance then requires only a small additional outlay, since only those structures which determine the gate-source capacitance of the fourth transistor have to be modified in order to obtain the desired increase in capacitance.

Alternatively, or in addition, the capacitance may be formed by a capacitor and/or by a gate-source capacitance of a further, correspondingly connected field-effect transistor.

Other features which are considered as characteristic for the invention are set forth in the appended claims.

Although the invention is illustrated and described herein as embodied in a level converting circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a schematic circuit diagram of an exemplary embodiment of a level converting circuit.

DESCRIPTION OF THE PREFERRED EMBODIMENTS

Referring now to the sole FIGURE of the drawing in detail, there is seen a MOS field-effect transistor 1 of the p-channel type and a MOS field-effect transistor 2 of the p-channel type. The two MOSFETS 1 and 2 are connected to one another in such a way that the gate terminal of the transistor 1 is connected to the drain terminal of the transistor 2 and the gate terminal of the transistor 2 is connected to the drain terminal of the transistor 1. The source terminals of the two transistors 1 and 2 are connected to a positive first supply potential V1. The drain terminal of the transistor 2 is, furthermore, connected to an output terminal A of the level converting circuit and also to the drain terminal of a MOS field-effect transistor 3 of the n-channel type. The gate terminal of the transistor 3, whose source terminal is connected to a reference-ground potential M, is connected to the source terminal of a MOS field-effect transistor 4 of the n-channel type, whose drain terminal is coupled to the drain terminal of the transistor 1.

A capacitor 5 is connected between the gate terminal of the transistor 4 and the gate terminal of the transistor 3. The capacitor 5 is formed by a correspondingly connected MOS field-effect transistor of a given conductivity type, and the gate-source capacitance 6 of the transistor 4 is connected in parallel with the capacitor 5. The gate-source capacitance of the transistor 4 is in this case increased by corresponding configuration of the transistor structures of the transistor 4. Instead of both capacitances, it is also possible, in the same way, to use only one of the two capacitances.

The gate terminal of the transistor 4 is driven by means of a limiter device, which, in the exemplary embodiment, comprises a MOS field-effect transistor 7 of the p-channel type, whose control terminal is connected to the reference-ground potential M and whose drain-source path is connected between the gate terminal of the transistor 4 and a positive second supply potential V2. The drain terminal of the transistor 7 is connected to the gate terminal of the transistor 4 and the source terminal to the supply potential V2. A diode 8 is connected in parallel in the forward direction with the drain-source path of the transistor 7 between V2 and the gate of the transistor 4.

Also provided is a transistor 9, whose gate terminal is coupled to the output A and whose controlled path (source-drain) is connected in parallel with the controlled path (source-drain) of the transistor 7. The gate terminal of the transistor 9 and the output A are coupled through a buffer comprising two cascaded inverters. Finally, a buffer formed by an inverter is also connected upstream of the gate terminal of the transistor 3.

Each of the three inverters comprises two MOS field-effect transistors operated in push-pull mode, namely a respective transistor 11 and 13 and 15 of the p-channel type and a respective transistor 12 and 14 and 16 of the n-channel type. The gate terminals and the drain terminals of both transistors are respectively connected to one another, the two coupled drain terminals forming the output of the inverter circuit and the two coupled gate terminals forming the input of the inverter circuit and also an input. The source terminals are correspondingly connected to the second supply potential V2 and to the reference-ground potential M.

Finally, a diode 10 is connected in the reverse direction between the reference-ground potential M and the gate terminal of the transistor 4.

I claim:

1. A level converting circuit, comprising:
   an input and an output;
   a first transistor of a first conductivity type having a control terminal and a load path;
   a second transistor of the first conductivity type having a control terminal and a load path;
   said control terminals of said first and second transistors being connected to a first supply potential via said load path of a respective other one of said first and second transistors;
   a third transistor of a second conductivity type having a load path connected between said control terminal of said first transistor and a reference-ground potential and having a control terminal coupled to said input, and wherein a node between said second transistor and said third transistor form said output of the level converting circuit;
   a fourth transistor of the second conductivity type having a load path connected between said control terminal of said second transistor and said control terminal of said third transistor, and having a control terminal;
   a capacitance connected between said control terminal of said third transistor and said control terminal of said fourth transistor; and
   a limiter circuit connected to said control terminal of said fourth transistor.

2. The level converting circuit according to claim 1, wherein said limiter circuit includes:
   a fifth transistor having a control terminal connected to the reference-ground potential and having a controlled path connected between said control terminal of said fourth transistor and a second supply potential; and
   a diode connected in parallel in a forward direction thereof with said controlled path of said fifth transistor.

3. The level converting circuit according to claim 2, which further comprises a sixth transistor having a control terminal coupled to said output and having a controlled path connected in parallel with said controlled path of said fifth transistor.

4. The level converting circuit according to claim 3, which further comprises a first buffer connected between said control terminal of said sixth transistor and said output.

5. The level converting circuit according to claim 2, wherein said diode is a first diode, and including a second diode connected in a reverse direction between the reference-ground potential and said control terminal of said fourth transistor.

6. The level converting circuit according to claim 4, which further comprises a second buffer connected upstream of said control input of said fourth transistor.

7. The level converting circuit according to claim 1, which further comprises a buffer connected between said input and said control terminal of said fourth transistor.

8. The level converting circuit according to claim 1, wherein at least some of said first, second, third, and fourth transistors are MOS field-effect transistors.

9. The level converting circuit according to claim 3, wherein at least some of said first, second, third, fourth, fifth, and sixth transistors are MOS field-effect transistors.

10. The level converting circuit according to claim 1, wherein said fourth transistor is a MOS field-effect transistor, and said capacitance is a gate-source capacitance of said fourth transistor.

11. The level converting circuit according to claim 1, wherein said capacitance is formed by a capacitor.

12. The level converting circuit according to claim 11, wherein said capacitance is formed by a gate-source capacitance of a further field-effect transistor.

* * * * *